United States Patent
Park et al.

(10) Patent No.: US 11,442,202 B2
(45) Date of Patent: Sep. 13, 2022

(54) FOLDABLE DISPLAY DEVICE

(71) Applicant: Samsung Display Co., Ltd., Yongin-si (KR)

(72) Inventors: Dong Jin Park, Seongnam-si (KR); Dong Woo Seo, Suwon-si (KR); Jai Ku Shin, Hwaseong-si (KR); Sung Chul Choi, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/064,498

(22) Filed: Oct. 6, 2020

(65) Prior Publication Data

US 2021/0141124 A1    May 13, 2021

(30) Foreign Application Priority Data

Nov. 8, 2019   (KR) ................. 10-2019-0142718

(51) Int. Cl.
*H05K 7/02* (2006.01)
*H05K 7/04* (2006.01)
*G02B 1/14* (2015.01)
*H05K 5/02* (2006.01)
*H05K 5/00* (2006.01)

(52) U.S. Cl.
CPC ............. *G02B 1/14* (2015.01); *H05K 5/0017* (2013.01); *H05K 5/0226* (2013.01)

(58) Field of Classification Search
USPC .................. 361/807, 728, 809, 810
See application file for complete search history.

(56) References Cited

U.S. PATENT DOCUMENTS

| 9,173,287 | B1* | 10/2015 | Kim ...................... G06F 1/1616 |
| 9,947,726 | B2 | 4/2018 | Lee |
| 10,398,048 | B2 | 8/2019 | Jeon |
| 10,516,119 | B2* | 12/2019 | Lee ..................... H01L 51/5256 |
| 2013/0216740 | A1* | 8/2013 | Russell-Clarke ...... B23K 26/38 |
| | | | 428/33 |

(Continued)

FOREIGN PATENT DOCUMENTS

KR   10-0389167   6/2003
KR   10-2017-0001819   1/2017

(Continued)

*Primary Examiner* — Hung S. Bui
(74) *Attorney, Agent, or Firm* — H.C. Park & Associates, PLC

(57) ABSTRACT

A foldable display device includes: a flexible display module including a first substantially non-bendable portion, a second substantially non-bendable portion, and a bendable portion between the first non-bendable portion and the second non-bendable portion; a support member disposed on the flexible display module, the support member including a hinge portion, a first portion connected to the hinge portion and supporting the first non-bendable portion, and a second portion connected to the hinge portion and supporting the second non-bendable portion to permit the first and second portions to rotate about the hinge portion; and a protective layer attached to the first portion and the second portion to cover the bendable portion disposed between the first portion and the second portion, the protective layer including a stretchable material having a mesh structure.

19 Claims, 10 Drawing Sheets

(56) References Cited

U.S. PATENT DOCUMENTS

| | | | |
|---|---|---|---|
| 2015/0370287 A1* | 12/2015 | Ko | G06F 1/1626 |
| | | | 361/749 |
| 2016/0209874 A1* | 7/2016 | Choi | G06F 1/1641 |
| 2016/0380033 A1* | 12/2016 | Lee | H01L 51/5253 |
| | | | 257/40 |
| 2017/0110687 A1 | 4/2017 | Kim et al. | |
| 2018/0150108 A1* | 5/2018 | Song | G09G 3/34 |
| 2018/0352664 A1 | 12/2018 | Park et al. | |

FOREIGN PATENT DOCUMENTS

| | | |
|---|---|---|
| KR | 10-2017-0045783 | 4/2017 |
| KR | 10-2018-0062271 | 6/2018 |
| KR | 10-2018-0133287 | 12/2018 |
| KR | 10-2019-0037585 | 4/2019 |

\* cited by examiner

FOLDABLE DISPLAY DEVICE

CROSS-REFERENCE TO RELATED APPLICATION

This application claims priority from and the benefit of Korean Patent Application No. 10-2019-0142718 filed on Nov. 8, 2019, which is hereby incorporated by reference for all purposes as if fully set forth herein.

BACKGROUND

Field

Exemplary implementations of the invention relate generally to a display device, and more specifically, to a foldable display device.

Discussion of the Background

A display device may provide information to a user by displaying an image. Recently, a flexible display device deformable in various forms has been developed. Unlike a flat panel display, the flexible display device may be folded, bent, or rolled like a paper. The flexible display device can be portable and can improve convenience of the user.

The above information disclosed in this Background section is only for understanding of the background of the inventive concepts, and, therefore, it may contain information that does not constitute prior art.

SUMMARY

Applicant discovered that foreign substances that can interfere with the functionality and/or reliability of a foldable display device may be introduced into the display device at the bendable portion of the device.

Foldable display devices constructed according to the principles and exemplary implementations of the invention have improved reliability. For example, the foldable display device may include a protective layer to cover a bendable portion of a display module. In one specific implementation, the protective layer may include a stretchable material such as synthetic textile having a mesh structure, so that the protective layer blocks foreign substances from being introduced to the bendable portion of the display module and the display module and/or the foldable display device has improved reliability.

Additional features of the inventive concepts will be set forth in the description which follows, and in part will be apparent from the description, or may be learned by practice of the inventive concepts.

According to one aspect of the invention, a foldable display device includes: a flexible display module including a first substantially non-bendable portion, a second substantially non-bendable portion, and a bendable portion between the first non-bendable portion and the second non-bendable portion; a support member disposed on the flexible display module, the support member including a hinge portion, a first portion connected to the hinge portion and supporting the first non-bendable portion, and a second portion connected to the hinge portion and supporting the second non-bendable portion to permit the first and second portions to rotate about the hinge portion; and a protective layer attached to the first portion and the second portion to cover the bendable portion disposed between the first portion and the second portion, the protective layer including a stretchable material having a mesh structure.

The protective layer may include a film formed of at least one of nylon and polyurethane (PU).

The stretchable material may include a synthetic textile including twisted filaments coupled to each other, and each of the filaments may have a thickness of about 20 µm to about 400 µm.

The protective layer may include at least one hole formed by the filaments, and the at least one hole may have a width of about 40 µm or less.

The protective layer may include a plurality of sub-protective layers stacked on each other and each formed of the stretchable material having the mesh structure.

The support member may include a folding unit, the first portion may include a first support portion, and the second portion may include a second support portion. The first support portion may include a first cover disposed on the first non-bendable portion and a first support plate disposed between the first non-bendable portion and the first cover. The second support portion may include a second cover disposed on the second non-bendable portion and a second support plate disposed between the second non-bendable portion and the second cover.

The protective layer may be attached to the first support plate and the second support plate.

The protective layer may be attached to the first cover and the second cover.

The protective layer may be attached to an upper surface of the first cover and an upper surface of the second cover.

The protective layer may be attached to a lower surface of the first cover and a lower surface of the second cover.

The first support portion may further include a third support plate disposed between the first non-bendable portion and the first support plate, and the second support portion may further include a fourth support plate disposed between the second non-bendable portion and the second support plate.

The protective layer may be attached to the third support plate and the fourth support plate.

The folding unit may further include a fifth support plate disposed between the third support plate and the fourth support plate and having a lattice pattern.

Each of the first support plate and the second support plate may be formed of at least one of stainless steel, copper (Cu), and graphite.

Each of the first support plate and the second support plate may include: a first sub-support plate formed of stainless steel; a second sub-support plate disposed on the first sub-support plate and formed of stainless steel; and a third sub-support plate disposed between the first sub-support plate and the second sub-support plate and formed of at least one of copper and graphite.

The protective layer may have a first end and a second end attached to the first portion and the second portion, respectively, and a distance between the first end and the second end of the protective layer may be at least four times a radius of curvature of the bendable portion when the flexible display module is bent.

The foldable display device may further include: a first adhesive member disposed between the first end of the protective layer and the first portion; and a second adhesive member disposed between the second end of the protective layer and the second portion.

The foldable display device may further include: a protective member disposed between the flexible display module and the support member, the protective member including a base layer and a cushion layer disposed on the base layer and having a porous structure.

The cushion layer may be formed of a synthetic resin foam.

The first non-bendable portion and the second non-bendable portion each may have a display surface that faces each other when the flexible display module is bent.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
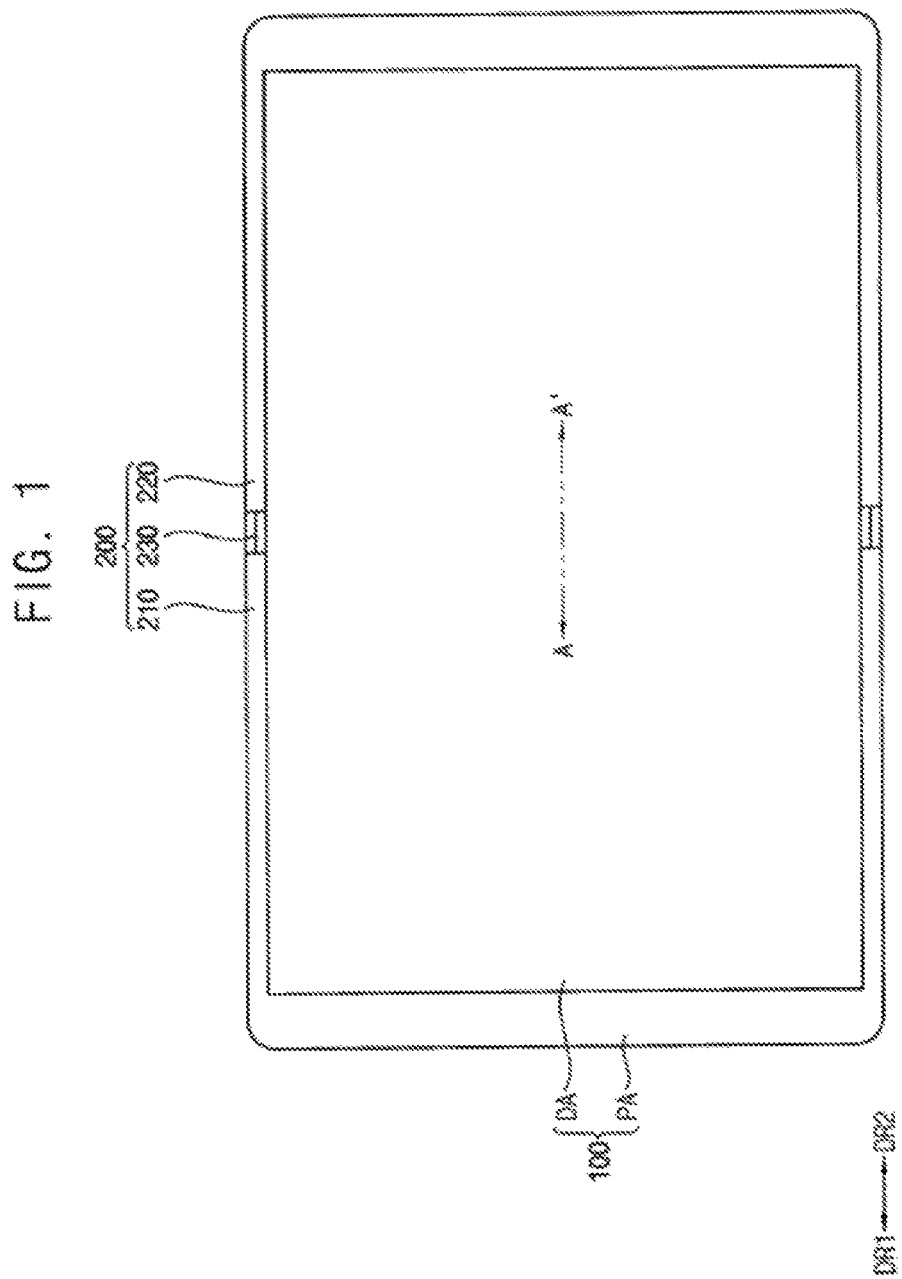
FIG. 1 is a plan view of an exemplary embodiment of a foldable display device constructed according to the principles of the invention in an unfolded position.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
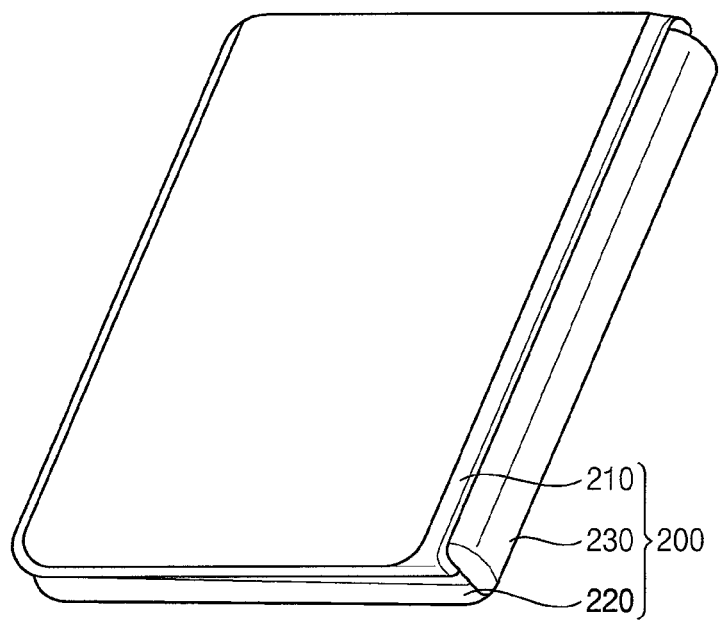
FIG. 2 is a perspective view of the foldable display device of FIG. 1 in a folded position.

FIG. 1 is a plan view of an exemplary embodiment of a foldable display device constructed according to the principles of the invention in an unfolded position. FIG. 2 is a perspective view of the foldable display device of FIG. 1 in a folded position.

Referring to FIGS. 1 and 2, a foldable display device may include a flexible display module 100 and a support member, which may be in the form of a folding unit 200.

The flexible display module 100 may include a display area DA and a peripheral area PA. The display area DA may display an image, and the peripheral area PA may surround the display area PA to form a bezel of the foldable display device.

The flexible display module 100 may include a flexible substrate including flexible plastic or the like, instead of a rigid substrate including rigid glass or the like. Accordingly, the flexible display module 100 may be folded or unfolded freely within a predetermined range. The flexible display module 100 may be supported to be folded or unfolded by the folding unit 200.

The folding unit 200 may include a first support portion 210, a second support portion 220, and a hinge portion 230. The first support portion 210 may be connected to the hinge portion 230 in a first direction DR1, and the second support portion 220 may be connected to the hinge portion 230 in a second direction DR2 opposite to the first direction DR1. The hinge portion 230 may be positioned between the first support portion 210 and the second support portion 220 to permit folding of the first and second support portions 210, 220 about the hinge portion 230.

Figure 3:
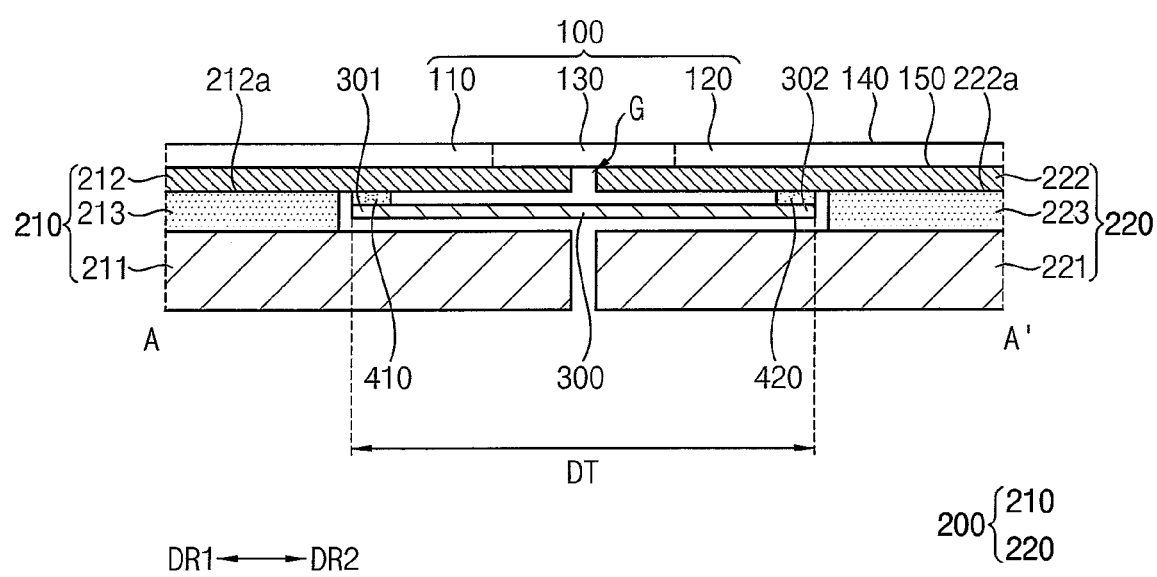
FIG. 3 is a cross-sectional view taken along line A-A' of FIG. 1.

FIG. 3 is a cross-sectional view taken along line A-A' of FIG. 1.

Referring to FIG. 3, the foldable display device may include a flexible display module 100, a folding unit 200, and a protective layer, which may be in the form of a protective film 300.

The flexible display module 100 may include a first substantially non-bendable portion 110, a second substantially non-bendable portion 120, and a bendable portion 130. The bendable portion 130 may be positioned between the first non-bendable portion 110 and the second non-bendable portion 120. The first non-bendable portion 110 may be positioned in the first direction DR1 from the bendable portion 130, and the second non-bendable portion 120 may be positioned in the second direction DR2 from the bendable portion 130. The first non-bendable portion 110 and the second non-bendable portion 120 may be substantially rigid and may not be foldable. The bendable portion 130 may be flexible and may be foldable.

The flexible display module 100 may include a display surface 140 and a back surface 150 opposite to the display surface 140. The flexible display module 100 may display an image toward the display surface 140. The back surface 150 may be a non-display surface on which an image is not displayed. The folding unit 200 including the first support portion 210 and the second support portion 220 may be disposed on the back surface 150 of the flexible display module 100.

The first support portion 210 may include a first cover 211, a first support plate 212, and a first adhesive layer 213.

The first cover 211 may be disposed on the first non-bendable portion 110 of the flexible display module 100. The first cover 211 may be disposed on and overlap the back surface 150 of the first non-bendable portion 110 and the back surface 150 of the bendable portion 130 adjacent to the first non-bendable portion 110 to protect the back surface 150 of the first non-bendable portion 110 and the back surface 150 of the bendable portion 130 adjacent to the first non-bendable portion 110.

The first support plate 212 may be disposed between the first non-bendable portion 110 of the flexible display module 100 and the first cover 211. The first support plate 212 may support the first non-bendable portion 110 and the bendable portion 130 adjacent to the first non-bendable portion 110. For example, an adhesive layer may be interposed between the first support plate 212 and the back surface 150 of the first non-bendable portion 110. The first support plate 212 may be attached to the first non-bendable portion 110 to support the first non-bendable portion 110 in a fixed state. Further, the first support plate 212 may support the bendable portion 130 adjacent to the first non-bendable portion 110 in an unfixed state without being attached to the bendable portion 130 adjacent to the first non-bendable portion 110.

The first adhesive layer 213 may be disposed between the first cover 211 and the first support plate 212. The first adhesive layer 213 may combine and/or attach the first cover 211 and the first support plate 212. The first adhesive layer 213 may overlap at least a portion of the first non-bendable portion 110, and may not overlap the bendable portion 130.

The second support portion 220 may include a second cover 221, a second support plate 222, and a second adhesive layer 223.

The second cover 221 may be disposed on the second non-bendable portion 120 of the flexible display module 100. The second cover 221 may be disposed on and overlap the back surface 150 of the second non-bendable portion 120 and the back surface 150 of the bendable portion 130 adjacent to the second non-bendable portion 120 to protect the back surface 150 of the second non-bendable portion 120 and the back surface 150 of the bendable portion 130 adjacent to the second non-bendable portion 120.

The second support plate 222 may be disposed between the second non-bendable portion 120 of the flexible display module 100 and the second cover 221. The second support plate 222 may support the second non-bendable portion 120 and the bendable portion 130 adjacent to the second non-bendable portion 120. For example, an adhesive layer may be interposed between the second support plate 222 and the back surface 150 of the second non-bendable portion 120. The second support plate 222 may be attached to the second non-bendable portion 120 to support the second non-bendable portion 120 in a fixed state. Further, the second support plate 222 may support the bendable portion 130 adjacent to the second non-bendable portion 120 in an unfixed state without being attached to the bendable portion 130 adjacent to the second non-bendable portion 120.

The second adhesive layer 223 may be disposed between the second cover 221 and the second support plate 222. The second adhesive layer 223 may combine and/or attach the second cover 221 and the second support plate 222. The second adhesive layer 223 may overlap at least a portion of the second non-bendable portion 120, and may not overlap the bendable portion 130.

The first support plate 212 and the second support plate 222 may be spaced apart from each other at a predetermined interval. Accordingly, a portion of the back surface 150 of the bending portion 130 of the flexible display module 100 corresponding to a space and/or a gap G between the first support plate 212 and the second support plate 222 may be exposed by the space and/or gap G between the first support plate 212 and the second support plate 222.

Each of the first support plate 212 and the second support plate 222 may be formed of at least one of stainless steel (SUS), copper (Cu), and graphite. The durability of each of the first support plate 212 and the second support plate 222 may be improved when each of the first support plate 212 and the second support plate 222 is formed of stainless steel. Further, heat dissipation characteristics of each of the first support plate 212 and the second support plate 222 may be improved when each of the first support plate 212 and the second support plate 222 is formed of copper or graphite.

The protective film 300 may be attached to the first support portion 210 and the second support portion 220 to cover the back surface 150 of the bendable portion 130 of the flexible display module 100 including the gap G exposed by the first support portion 210 and the second support portion 220. A first end 301 of the protective film 300 may be attached to the first support portion 210, and a second end 302 of the protective film 300 may be attached to the second support portion 220.

In an exemplary embodiment, a first adhesive member 410 may be disposed between the first end 301 of the protective film 300 and the first support portion 210, and a second adhesive member 420 may be disposed between the second end 302 of the protective film 300 and the second support portion 220. The first adhesive member 410 may bond the first end 301 of the protective film 300 to the first support portion 210, and the second adhesive member 420 may bond the second end 302 of the protective film 300 to the second support portion 220.

In an exemplary embodiment, each of the first adhesive member 410 and the second adhesive member 420 may be a double-sided adhesive in which both opposite sides have adhesion. In this case, one side of the first adhesive member 410 and one side of the second adhesive member 420 may respectively adhere to the first support portion 210 and the second support portion 220, and the other side of the first adhesive member 410 and the other side of the second adhesive member 420 may respectively adhere to the first end 301 of the protective film 300 and the second end 302 of the protective film 300.

In an exemplary embodiment, the protective film 300 may be attached to the first support plate 212 and the second support plate 222. For example, the protective film 300 may be disposed in a region formed between the first cover 211 and the first support plate 212 and between the second cover 221 and the second support plate 222, and the first end 301 of the protective film 300 may be attached to a lower surface 212a of the first support plate 212, and the second end 302 of the protective film 300 may be attached to a lower surface 222a of the second support plate 222. Accordingly, the protective film 300 may cover and/or overlap the back surface 150 of the bendable portion 130, including the gap G. In this case, the first adhesive member 410 may be disposed between the lower surface 212a of the first support plate 212 and the first end 301 of the protective film 300, and the second adhesive member 420 may be disposed between the lower surface 222a of the second support plate 222 and the second end 302 of the protective film 300.

Figure 4:
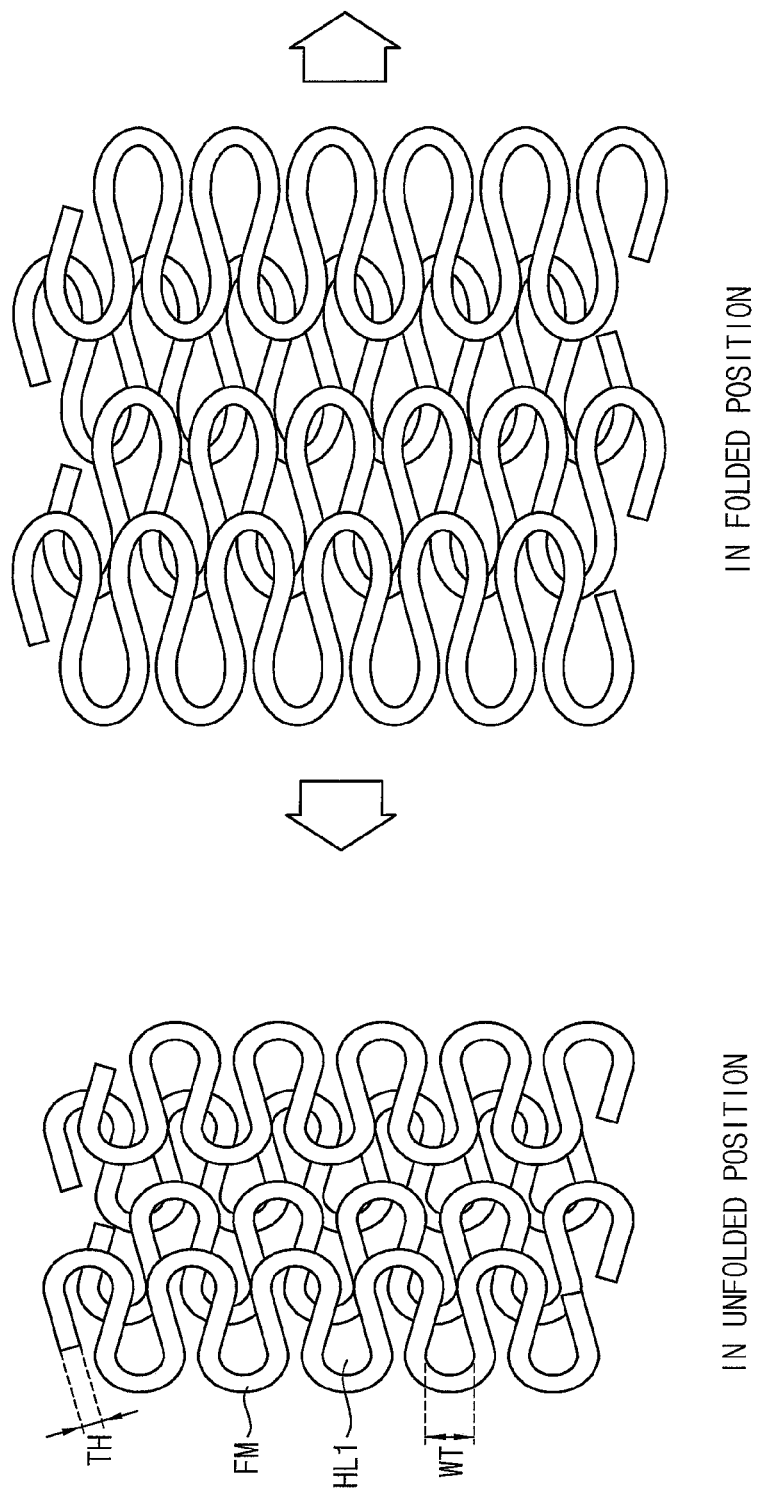
FIG. 4 is an enlarged plan view illustrating a portion of an exemplary embodiment of the protective film of FIG. 3 when the display device is in an unfolded position and a folded position.

FIG. 4 is an enlarged plan view illustrating a portion of an exemplary embodiment of the protective film of FIG. 3 when the display device is in an unfolded position and a folded position.

Referring to FIGS. 3 and 4, the protective film 300 may be formed of a stretchable material, such as a synthetic textile having a mesh structure. In an exemplary embodiment, the protective film 300 may be formed of at least one of nylon and polyurethane (PU).

The protective film 300 may include a plurality of filaments FM twisted and coupled to each other. The filaments FM may serve to block foreign substances from entering and/or being introduced through the protective film 300 and into the bendable portion 130 of the flexible display module 100 from outside.

The filaments FM may be formed of the synthetic textiles having a mesh structure. The protective film 300 may include holes HL1 formed by the filaments FM. In an exemplary embodiment, a width WT of each of the holes HL1 may be about 40 μm or less. Since the width WT of each of the holes HL1 is about 40 μm or less, foreign substances whose widths are greater than about 40 μm may not pass through the protective film 300. Accordingly, the protective film 300 may block the foreign substances from entering and/or being introduced onto the back surface 150 of the bendable portion 130 of the flexible display module 100.

In an exemplary embodiment, the thickness TH of each of the filaments FM may be from about 20 μm to about 400 μm. As the thickness TH of each of the filaments FM increases, the width WT of each of the holes HL1 may decrease. Accordingly, as the thickness TH of each of the filaments FM increases, sizes of foreign substances which the protective film 300 can block may decrease.

Since the protective film 300 is formed of the synthetic textile having the mesh structure, the protective film 300 may be stretchable and/or deformable. Because the protective film 300 is stretchable, the protective film 300 may be deformed according to movements of the first support portion 210 and the second support portion 220 to which the protective film 300 is attached. For example, the filaments FM of the protective film 300 may stretched in a direction to which a tensile stress is applied when the tensile stress is applied to the protective film 300. Therefore, the length of the protective film 300 may increase in the direction in which the tensile stress is applied.

The back surface 150 of the bendable portion 130 of the flexible display module 100 exposed by the first support portion 210 and the second support portion 220 may be blocked from the outside by the protective film 300. Accordingly, the protective film 300 may block foreign substances from entering and/or being introduced into the flexible display module 100 through the space and/or gap G between the first support portion 210 and the second support portion 220 from the outside, and thus the reliability of the foldable display device may be improved.

Figure 5:
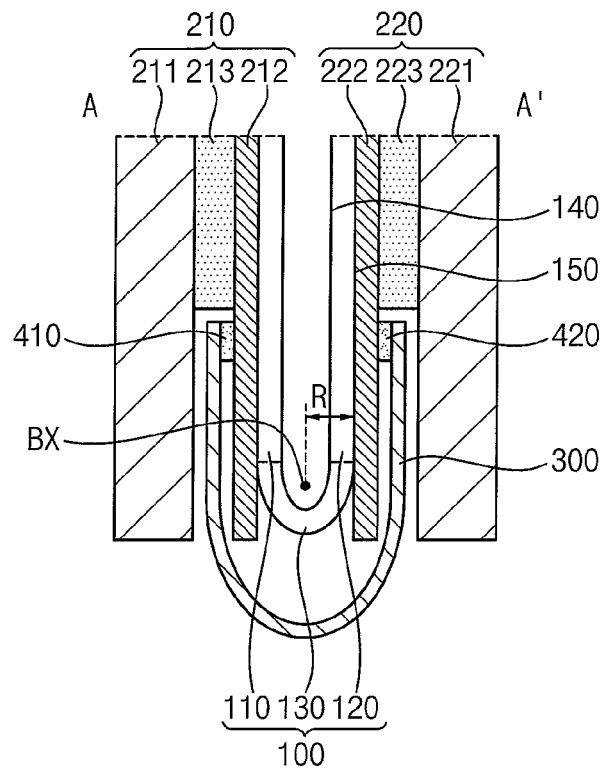
FIG. 5 is a cross-sectional view of the foldable display device of FIG. 3 in a folded position.

FIG. 5 is a cross-sectional view of the foldable display device of FIG. 3 in a folded position.

Referring to FIGS. 3 and 5, in an unfolded position, the flexible display module 100 may be unfolded such that portions of the display surface 140 are horizontally arranged on the same plane. For example, when an external force is applied to the folded foldable display device in an outward direction, the first support portion 210 and the second support portion 220 may be rotated in a counterclockwise direction and in a clockwise direction about the hinge portion, respectively, so that the flexible display module 100 may be unfolded. When the flexible display module 100 is unfolded, the display surface 140 of the first non-bendable portion 110 and the display surface 140 of the second non-bendable portion 120 may be substantially parallel to each other.

In a folded position, the flexible display module 100 may be inwardly folded such that the portions of the display surface 140 face each other. For example, when the external force is applied to the unfolded foldable display device in an inward direction, the first support portion 210 and the second support portion 220 may be rotated in a clockwise direction and in a counterclockwise direction about the hinge portion, respectively, so that the flexible display module 100 may be folded. When the flexible display module 100 is folded, the display surface 140 of the first non-bendable portion 110 and the display surface 140 of the second non-bendable portion 120 may face each other.

The protective film 300 may contract (shrink) when the flexible display module 100 is unfolded, and the protective film 300 may expand (stretch) when the flexible display module 100 is folded as shown in FIG. 4. Since the interval between the first support portion 210 and the second support portion 220 decreases when the flexible display module 100 is unfolded, the flexible protective film 300 attached to the first support portion 210 and the second support portion 220 may shrink into a substantially flat shape due to its inherent, elastic restoring force. Since the interval between the first support portion 210 and the second support portion 220 increases when the flexible display module 100 is folded, the flexible protective film 300 attached to the first support portion 210 and the second support portion 220 may expand into a bent shape along the shape of the bendable portion 130 of the flexible display module 100 due to tensile stress.

In an exemplary embodiment, a distance DT between the first end 301 and the second end 302 of the protective film 300 may be at least four times the radius of curvature R of the bendable portion 130 of the flexible display module 100 when the flexible display module 100 is bent. In such an exemplary embodiment, the radius of curvature R of the bendable portion 130 of the flexible display module 100 may be a distance from a bending axis BX to the back surface 150 of the first non-bendable portion 110 or the back surface 150 of the second non-bendable portion 120 when the flexible display module 100 is bent. When the distance DT between the first end 301 and the second end 302 of the protective film 300 (e.g., a length of the protective film 300 in the first direction DR1) is relatively small, the degree of expansion of the protective film 300 due to the bending of the flexible display module 100 may be relatively large. When the degree of expansion of the protective film 300 exceeds the maximum expansion degree of the protective film 300, the protective film 300 may be damaged. Accordingly, the protective film 300 may not be properly stretched, and/or the protective film 300 may not block the inflow and/or introduction of foreign substances. However, the distance DT between the first end 301 and the second end 302 of the protective film 300 may be at least four times the radius of curvature R of the bendable portion 130 of the flexible display module 100 such that the protective film 300 has a length sufficient to be stretched in response to the bending of the flexible display module 100. Accordingly, the damage of the protective film 300 due to the bending of the flexible display module 100 may be prevented.

Figure 6:
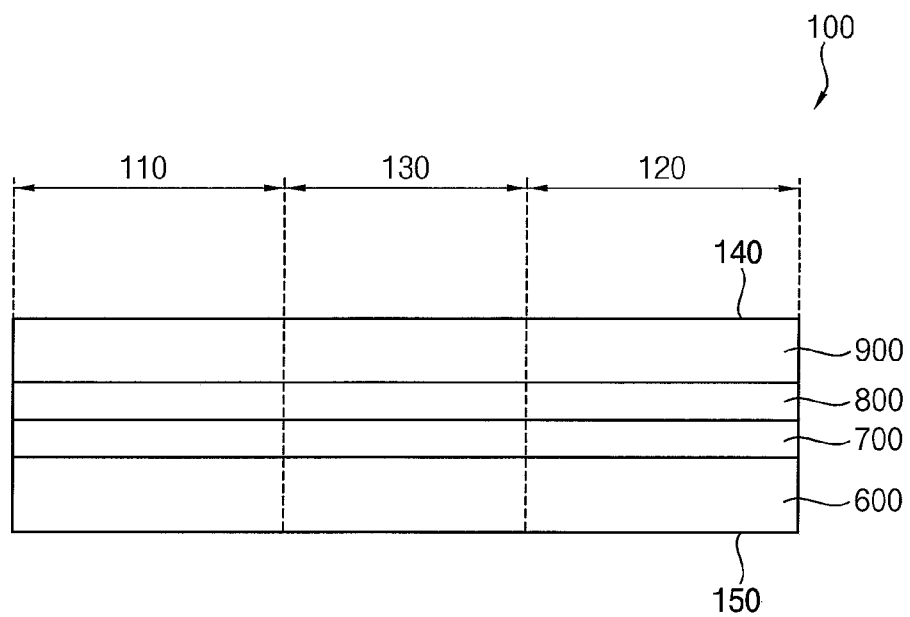
FIG. 6 is a cross-sectional view of an exemplary embodiment of the flexible display module of FIG. 1.

FIG. 6 is a cross-sectional view of an exemplary embodiment of the flexible display module of FIG. 1.

Referring to FIG. 6, the flexible display module 100 may include a display panel 600, a sensing layer 700, a polarization layer 800, and a window 900. As described above, since the flexible display module 100 may be folded or unfolded, each of the display panel 600, the sensing layer 700, the polarization layer 800, and the window 900 may have flexible characteristics.

The display panel 600 may include a plurality of pixels, and may generate an image formed by combining light beams emitted from the pixels. The display panel 600 may include a first surface and a second surface that are opposite to each other. The display panel 600 may display the image toward the first surface, and the second surface of the display panel 600 may correspond to the back surface 150 of the flexible display module 100.

The sensing layer 700 may be disposed on the display panel 600. The sensing layer 700 may sense an external input such as an external object that comes into contact with or approaches the foldable display device. For example, the sensing layer 700 may sense the external input by using a capacitive scheme.

The polarization layer 800 may be disposed on the sensing layer 700. The polarization layer 800 may reduce a reflection of external light of the foldable display device. For example, when the external light passes through the polarization layer 800, is reflected from a lower portion of the polarization layer 800 (for example, the display panel 600), and passes through the polarization layer 800 again, the external light passes through the polarization layer 800 twice, and thus the phase of the external light may be changed. Accordingly, the phase of the reflected light is different from the phase of the incident light entering the polarization layer 800, so that destructive interference may occur, and the reflection of the external light decreases, so that the visibility of the foldable display device may be improved.

The window 900 may be disposed on the polarization layer 800. The window 900 may protect the display panel 600, the sensing layer 700, and the polarization layer 800 from external shocks, and may provide the display surface 140 of the flexible display module 100. In an exemplary embodiment, the windows 900 may include polymer resin such as polycarbonate (PC), polymethyl methacrylate (PMMA), polyarylate (PAR), polyethersulfone (PES), polyethylene terephthalate (PET), or polyethylene naphthalate (PEN), glass and the like.

Figure 7:
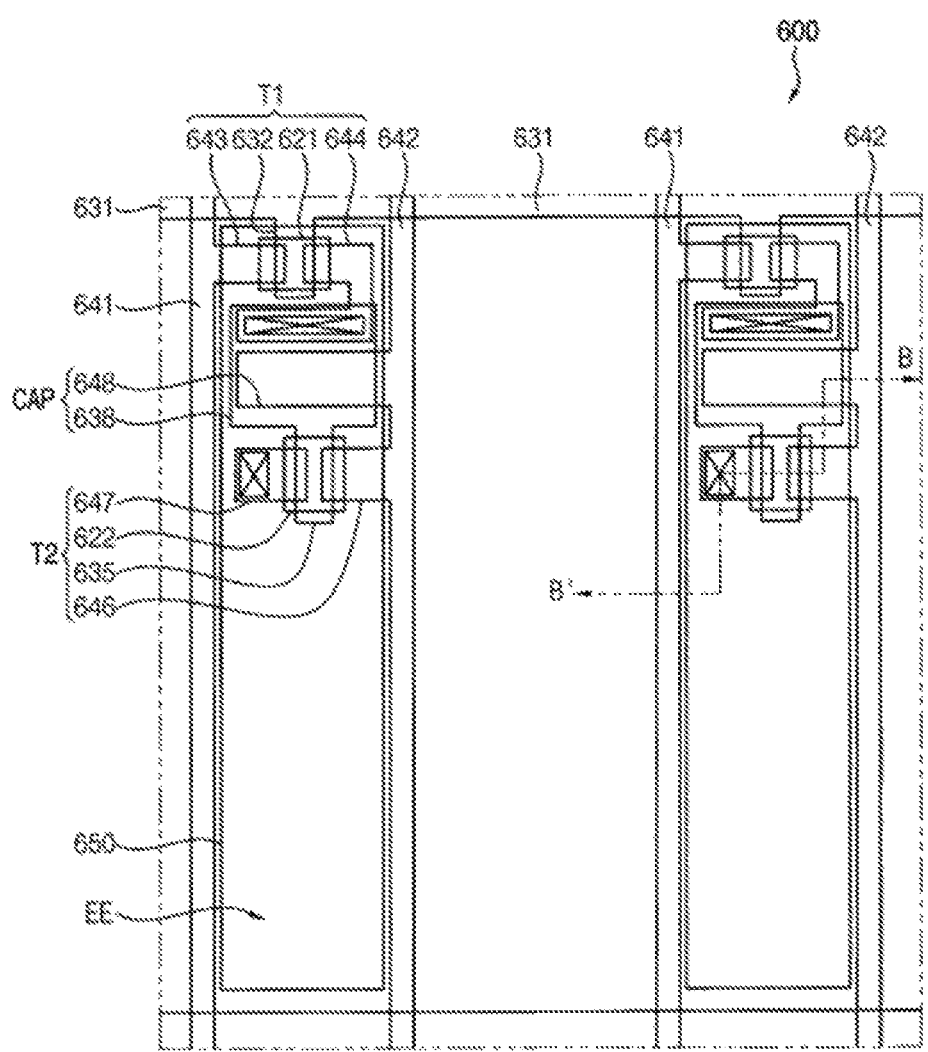
FIG. 7 is a plan view of a portion of an exemplary embodiment of the display panel of FIG. 6.
Figure 8:
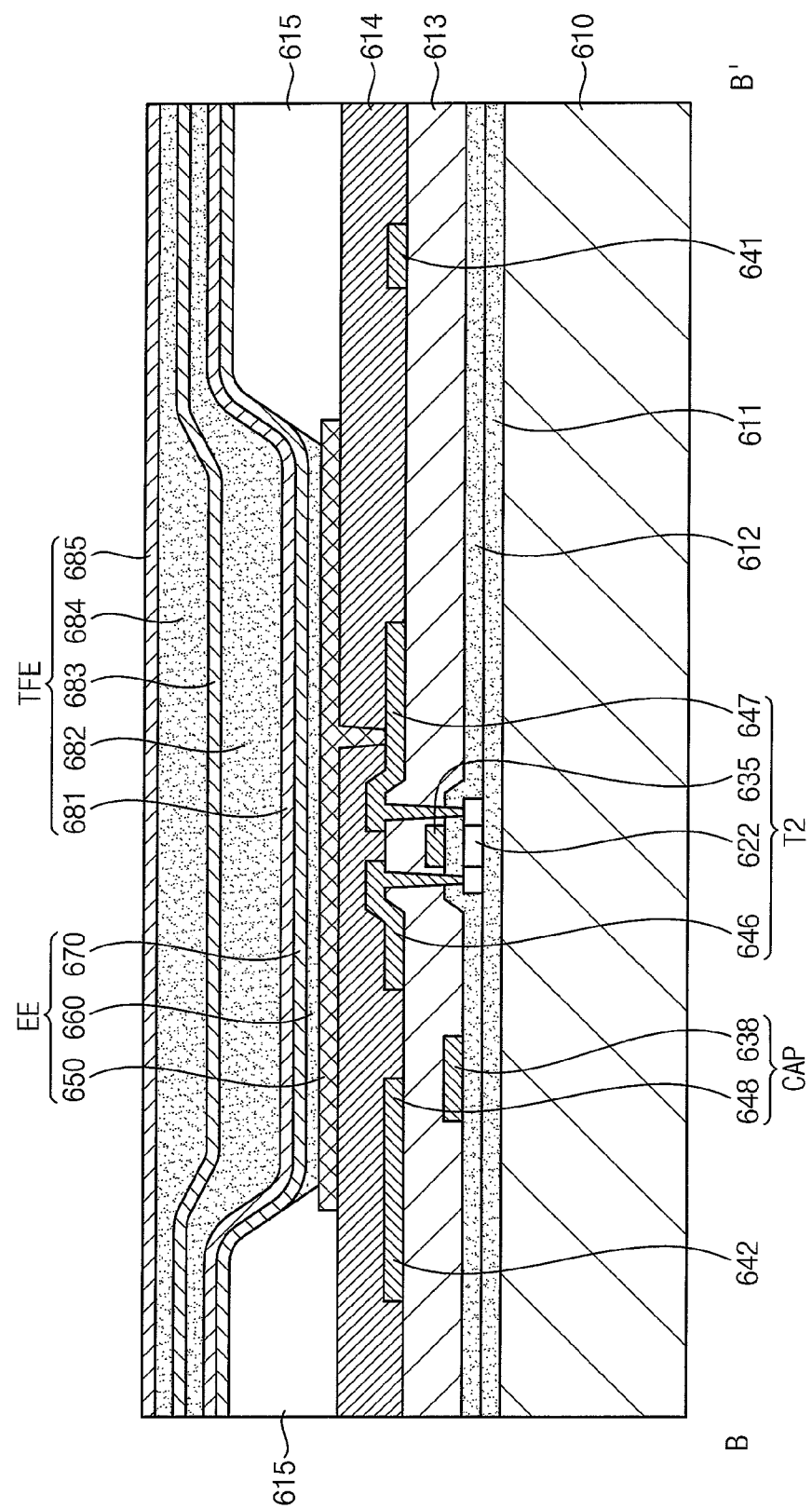
FIG. 8 is a cross-sectional view taken along line B-B' of FIG. 7.

FIG. 7 is a plan view of a portion of an exemplary embodiment of the display panel of FIG. 6. FIG. 8 is a cross-sectional view taken along line B-B' of FIG. 7.

Referring to FIGS. 7 and 8, the display panel 600 may include a plurality of pixels each including a switching thin film transistor T1, a driving thin film transistor T2, a capacitor CAP, and a light emitting element EE. The pixel denotes a minimum unit for displaying an image, and the display panel 600 may display the image through the pixels.

While FIGS. 7 and 8 illustrate that two thin film transistors and one capacitor are disposed in one pixel, exemplary embodiments are not limited thereto, and one pixel may be provided with at least three thin film transistors and/or at least two capacitors.

The display panel 600 may include a substrate 610, a gate line 631 disposed on the substrate 610, a data line 641 insulated from and intersected with the gate line 631, and a common power line 642. In general, one pixel may be defined by a boundary between the gate line 631, the data line 641, and the common power line 642, but the pixel is not limited to the above-described definition. The pixel may be defined by a black matrix or a pixel defining layer.

The substrate 610 may include a flexible material such as plastic. For example, the substrate 610 may be formed of polyethersulfone (PES), polycarbonate (PC), polyimide (PI), polyethylene terephthalate (PET), polyethylene naphthalate (PEN), polyacrylate (PAR), fiber reinforced plastic (FRP), or the like.

The substrate 610 may have a thickness of about 5 μm to about 200 μm. When the substrate 610 has a thickness less than about 5 μm, it may be difficult for the substrate 610 to stably support the light emitting element EE. In addition, when the substrate 610 has a thickness greater than about 200 μm, the flexible characteristics of the substrate 610 may be deteriorated.

The buffer layer 611 may be disposed on the substrate 610. The buffer layer 611 may serve to prevent the penetration of impurities and planarize a surface. The buffer layer 611 may be formed of silicon nitride, silicon oxide, silicon oxynitride, or the like. However, the buffer layer 611 is not necessarily required, and may be omitted according to a type of the substrate 610 and processing conditions.

A switching semiconductor layer 621 and a driving semiconductor layer 622 may be disposed on the buffer layer 611. The switching semiconductor layer 621 and the driving semiconductor layer 622 may be formed of one of polycrystalline silicon, amorphous silicon, and oxide semiconductors such as indium gallium zinc oxide (IGZO), indium zinc tin oxide (IZTO) or the like. For example, when the driving semiconductor layer 622 is formed of polycrystalline silicon, the driving semiconductor layer 622 may include a channel region that is not doped with impurities, and a source region and a drain region that are formed by doping impurities on opposite sides of the channel region. In this case, the doped impurities are P-type impurities such as boron (B), and $B_2H_6$ may be mainly used. The impurities may vary depending on the type of thin film transistor. While the thin film transistor having a PMOS structure using the P-type impurities is used as the driving thin film transistor T2 in the illustrated embodiment, the exemplary embodiments are not limited thereto, and a thin film transistor having an NMOS structure or a CMOS structure may be used as the driving thin film transistor T2.

A gate insulating layer 612 may be disposed on the switching semiconductor layer 621 and the driving semiconductor layer 622. The gate insulating layer 612 may be formed of tetraethoxysilane (TEOS), silicon nitride, silicon oxide, or the like. In an exemplary embodiment, the gate insulating layer 612 may have a double-layer structure in which a silicon nitride layer having a thickness of about 40 nm and a tetraethoxysilane layer having a thickness of about 80 nm are sequentially stacked.

A gate wiring including gate electrodes 632 and 635 may be disposed on the gate insulating layer 612. The gate wiring may further include a gate line 631, a first power storage plate 638, and the like. The gate electrodes 632 and 635 may be disposed to overlap at least a portion (e.g., the channel region) of the semiconductor layers 621 and 622. When the impurities are doped in the source region and the drain region of the semiconductor layers 621 and 622 in the process of forming the semiconductor layers 621 and 622, the gate electrodes 632 and 635 may serve to block the impurities from being doped in the channel region.

The gate electrodes 632 and 635 and the first power storage plate 638 may be disposed on the same layer, and may be formed of substantially the same metal. For example, the gate electrodes 632 and 635 and the first power storage plate 638 may be formed of molybdenum (Mo), chromium (Cr), tungsten (W), or the like.

An interlayer insulating layer 613 covering the gate electrodes 632 and 635 may be disposed on the gate insulating layer 612. Like the gate insulating layer 612, the interlayer insulating layer 613 may be formed of tetraethoxysilane, silicon nitride, silicon oxide, or the like, but the material of the interlayer insulating layer 613 is not limited thereto.

Data wirings including source electrodes 643 and 646 and drain electrodes 644 and 647 may be disposed on the interlayer insulating layer 613. The data wiring may further include a data line 641, a common power line 642, a second power storage plate 648, and the like. The source electrodes 643 and 646 and the drain electrodes 644 and 647 may be connected to the source region and the drain region of the semiconductor layers 621 and 622 through contact holes formed in the gate insulating layer 612 and the interlayer insulating layer 613, respectively.

The switching thin film transistor T1 may include the switching semiconductor layer 621, a switching gate electrode 632, a switching source electrode 643, and a switching drain electrode 644, and the driving thin film transistor T2 may include the driving semiconductor layer 622, a driving gate electrode 635, a driving source electrode 646, and a driving drain electrode 647. In addition, the capacitor CAP may include the first power storage plate 638 and the second power storage plate 648 that are disposed with the interlayer insulating layer 613 therebetween.

The switching thin film transistor T1 may be used as a switching element for selecting a pixel configured to emit light. The switching gate electrode 632 may be connected to the gate line 631. The switching source electrode 643 may be connected to the data line 641. The switching drain electrode 644 may be spaced apart from the switching source electrode 643 and connected to the first power storage plate 638.

The driving thin film transistor T2 may apply a driving power, which allows the light emitting layer 660 of the light emitting element EE in the selected pixel, to the pixel electrode 650. The driving gate electrode 635 may be connected to the first power storage plate 638. The driving source electrode 646 and the second power storage plate 648 may be connected to the common power line 642. The driving drain electrode 647 may be connected to the pixel electrode 650 of the light emitting element EE through a contact hole.

According to the above structure, the switching thin film transistor T1 may be operated by a gate voltage applied to the gate line 631, thereby serving to transfer the data voltage applied to the data line 641 to the driving thin film transistor T2. A voltage corresponding to a difference between the common voltage applied from the common power line 642 to the driving thin film transistor T2 and the data voltage transferred from the switching thin film transistor T1 may be stored in the capacitor CAP, and a current corresponding to the voltage stored in the capacitor CAP flows into the light emitting element EE through the driving thin film transistor T2, so that the light emitting element EE may emit light.

A planarization layer 614 may be disposed on the interlayer insulating layer 613 to cover the data wirings patterned on the same layer as the data line 641, the common power line 642, the source electrodes 643 and 646, the drain electrodes 644 and 647, and the second power storage plate 648.

The planarization layer 614 may serve to remove and planarize steps to increase the luminance efficiency of the light emitting element EE formed thereon. The planarization layer 614 may be formed of acrylic-based resin (polyacrylates resin), epoxy resin, phenolic resins, polyamide-based resin, polyimide-based resin, unsaturated polyester-based resin, polyphenylene-based resin, polyphenylene sulfide-based resin, benzocyclobutene (BCB), or the like.

The pixel electrode 650 of the light emitting element EE may be disposed on the planarization layer 614. The pixel electrode 650 may be connected to the drain electrode 647 through a contact hole formed in the planarization layer 614.

A pixel defining layer 615 may be disposed on the planarization layer 614 to expose at least a portion of the pixel electrode 650 so as to define a pixel region. The pixel electrode 650 may be disposed to correspond to the pixel region of the pixel defining layer 615. The pixel defining layer 615 may be formed of polyacrylate-based resin, polyimide-based resin, or the like.

The light emitting layer 660 may be disposed on the pixel electrode 650 in the pixel region, and the common electrode 670 may be disposed on the pixel defining layer 615 and the light emitting layer 660. The light emitting layer 660 may be formed of a low molecular organic material or a high molecular organic material. At least one of a hole injection layer (HIL) and a hole transport layer (HTL) may be further disposed between the pixel electrode 650 and the light emitting layer 660, and at least one of an electron transport layer (ETL) and an electron injection layer (EIL) may be further disposed between the light emitting layer 660 and the common electrode 670.

Each of the pixel electrode 650 and the common electrode 670 may be formed as any one of a transmissive electrode, a transflective electrode, and a reflective electrode.

Transparent conductive oxide (TCO) may be used to form the transmissive electrode. The transparent conductive oxide (TCO) may include indium tin oxide (ITO), indium zinc oxide (IZO), zinc oxide (ZnO), indium oxide (111203), and the like.

In order to form the transflective electrode and the reflective electrode, metal such as magnesium (Mg), silver (Ag), gold (Au), calcium (Ca), lithium (Li), chromium (Cr), aluminum (Al), copper (Cu), or an alloy thereof may be used. The determination between the transflective electrode and the reflective electrode may depend on a thickness. In general, the transflective electrode may have a thickness of about 200 nm or less, and the reflective electrode may have a thickness of about 300 nm or more. The transflective electrode may have a higher light transmittance but have a higher resistance as the thickness decreases, and may have a lower light transmittance as the thickness increases. In addition, the transflective electrode and the reflective electrode may be formed in a multilayer structure including a metal layer formed of metal or a metal alloy and a transparent conductive oxide layer stacked on the metal layer.

A thin film encapsulation layer TFE may be disposed on the common electrode 670. The thin film encapsulation layer TFE may include at least one inorganic layer 681, 683, and 685, and at least one organic layer 682 and 684. The thin film encapsulation layer TFE may have a structure in which the inorganic layers 681, 683 and 685 and the organic layers 682 and 684 are alternately stacked. In this case, the inorganic layer 681 may be disposed at the bottom. In other words, the inorganic layer 681 may be disposed most adjacent to the light emitting element EE.

While FIG. 8 illustrates that the thin film encapsulation layer TFE includes three inorganic layers 681, 683 and 685 and two organic layers 682 and 684, exemplary embodiments are not limited thereto.

The inorganic layers 681, 683 and 685 may be formed of at least one inorganic material of $Al_2O_3$, $TiO_2$, ZrO, $SiO_2$, AlON, AlN, SiON, $Si_3N_4$, ZnO, and $Ta_2O_5$. The inorganic layers 681, 683 and 685 may be formed through chemical vapor deposition (CVD) or atomic layer deposition (ALD). The inorganic layers 681, 683 and 685 may mainly block the penetration of moisture or oxygen. The inorganic layers 681, 683 and 685 may block most of the moisture and oxygen from penetrating into the light emitting element EE.

The organic layers 682 and 684 may be formed of a polymer-based material. The polymer-based material may include acrylate-based resin, epoxy-based resin, polyimide, polyethylene, and the like. In addition, the organic layers 682 and 684 may be formed through a thermal deposition process. The thermal deposition process for forming the organic layers 682 and 684 may be performed within a temperature range that does not damage the light emitting element EE.

The thin film encapsulation layer TFE may have a thickness of about 10 μm or less. Accordingly, the overall thickness of the display panel 600 may be formed to be very thin. As such, the thin film encapsulation layer TFE may be disposed on the light emitting element EE, so that the flexible characteristics of the display panel 600 may be maximized.

Figure 9:
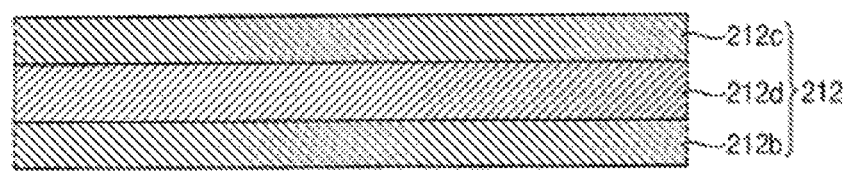
FIG. 9 is a cross-sectional view of an exemplary embodiment of the first support plate of FIG. 3.

FIG. 9 is a cross-sectional view of an exemplary embodiment of the first support plate of FIG. 3.

Referring to FIGS. 3 and 9, the first support plate 212 may include a plurality of sub-support plates stacked on each other. The structure of the second support plate 222 may be substantially the same as the structure of the first support plate 212, and repetitive description of the second support plate 222 will be omitted for conciseness.

In an exemplary embodiment, the first support plate 212 may include a first sub-support plate 212b, a second sub-support plate 212c disposed on the first sub-support plate 212b, and a third sub-support plate 212d disposed between the first sub-support plate 212b and the second sub-support plate 212c. FIG. 9 illustrates that the first support plate 212 includes three sub-support plates, however, exemplary embodiments are not limited thereto. In another exemplary embodiment, the first support plate 212 may include two, or four or more sub-support plates.

In an exemplary embodiment, each of the first sub-support plate 212b and the second sub-support plate 212c may be formed of stainless steel, and the third sub-support plate 212d may be formed of at least one of copper and graphite. In such an embodiment, a durability of the first support plate 212 may be improved by the first sub-support plate 212b and the second sub-support plate 212c, and heat dissipation characteristics of the first support plate 212 may be improved by the third sub-support plate 212d.

Figure 10:
FIG. 10 is a cross-sectional view of an exemplary embodiment of the protective film of FIG. 3.

FIG. 10 is a cross-sectional view of an exemplary embodiment of the protective film of FIG. 3.

Referring to FIGS. 3 and 10, in exemplary embodiments, the protective film 300 may include a plurality of sub-protective films stacked on each other. Each of the sub-protective films may be formed of a synthetic textile having a mesh structure.

In an exemplary embodiment, the protective film 300 may include a first sub-protective film 310 and a second sub-protective film 320 disposed on the first sub-protective film 310. FIG. 10 illustrates that the protective film 300 includes two sub-protective films, however, exemplary embodiments are not limited thereto. In another exemplary embodiment, the protective film 300 may include three or more sub-protective films.

The protective film 300 may include the plurality of sub-protective films stacked on each other, so that the protective film 300 may block foreign substrates having relatively small sizes from entering and/or being introduced into the bendable portion 130 of the flexible display module 100. For example, holes included in the plurality of sub-protective films may partially overlap each other, therefore, even if foreign substances introduced from outside passed through the hole of one sub-protective film, the foreign substances may not pass through the hole of the other sub-protective film.

Figure 11:
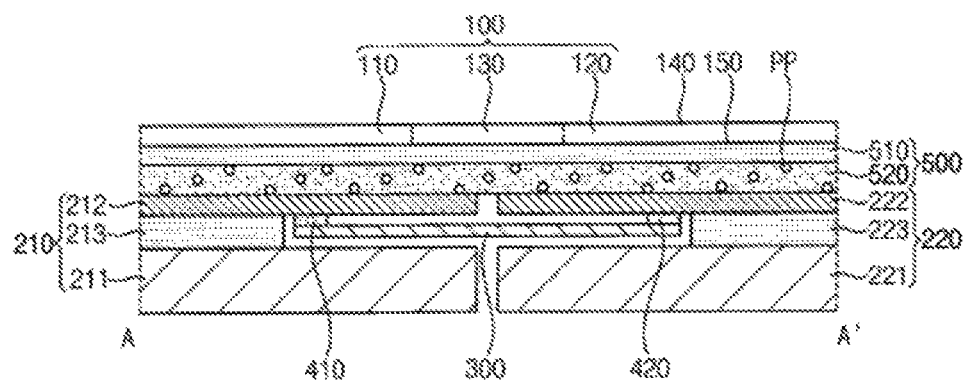
FIG. 11 is a cross-sectional view taken along line A-A' of FIG. 1 illustrating another exemplary embodiment of the foldable display device.

FIG. 11 is a cross-sectional view taken along line A-A' of FIG. 1 illustrating another exemplary embodiment of the foldable display device.

A foldable display device of FIG. 11 may be substantially the same as or similar to the foldable display device described with reference to FIG. 3 except for the addition of a protective member 500. Accordingly, descriptions of repeated elements may be omitted for conciseness.

Referring to FIG. 11, a foldable display device may further include the protective member 500. The protective member 500 may be disposed between the flexible display module 100 and the folding unit 200. The protective member 500 may include a base layer 510 and a cushion layer 520.

The base layer 510 may be disposed on the back surface 150 of the flexible display module 100. The base layer 510 may be formed of an insulation material. In an exemplary embodiment, the base layer 510 may be formed of a flexible insulating material, so that the base layer 510 may be easily deformed by a stress applied from outside. For example, the base layer 510 may be formed of polyimide (PI), polyethylene naphthalate (PEN), polyethylene terephthalate (PET), or the like.

The cushion layer 520 may be disposed between the base layer 510 and the folding unit 200. The cushion layer 520 may be formed directly on a lower surface of the base layer 510. The cushion layer 520 may be a porous structure. A plurality of pores PP may be defined in the cushion layer 520. The pores may easily absorb impact applied to the cushion layer 520, and thus the protective member 500 may protect the flexible display module from impact applied from outside. Further, even if foreign substances introduced from outside pass through the protective film 300, the pores PP may trap the foreign substances. Therefore, the protective member 500 may block foreign substances from being introduced into the flexible display module 100 from outside together with the protective film 300.

The cushion layer 520 may be formed of synthetic resin foam. For example, the cushion layer 520 may be formed of acrylonitrile butadiene styrene copolymer (ABS) foam, polyurethane (PU) foam, polyethylene (PE) foam, ethylene vinyl acetate (EVA) foam, polyvinyl chloride (PVC) foam, or the like.

Figure 12:
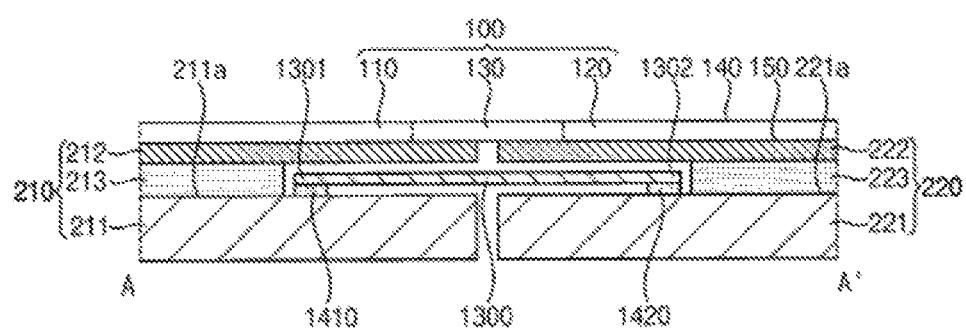
FIGS. 12 and 13 are cross-sectional views taken along line A-A' of FIG. 1 illustrating still other exemplary embodiments of the foldable display device.
Figure 13:
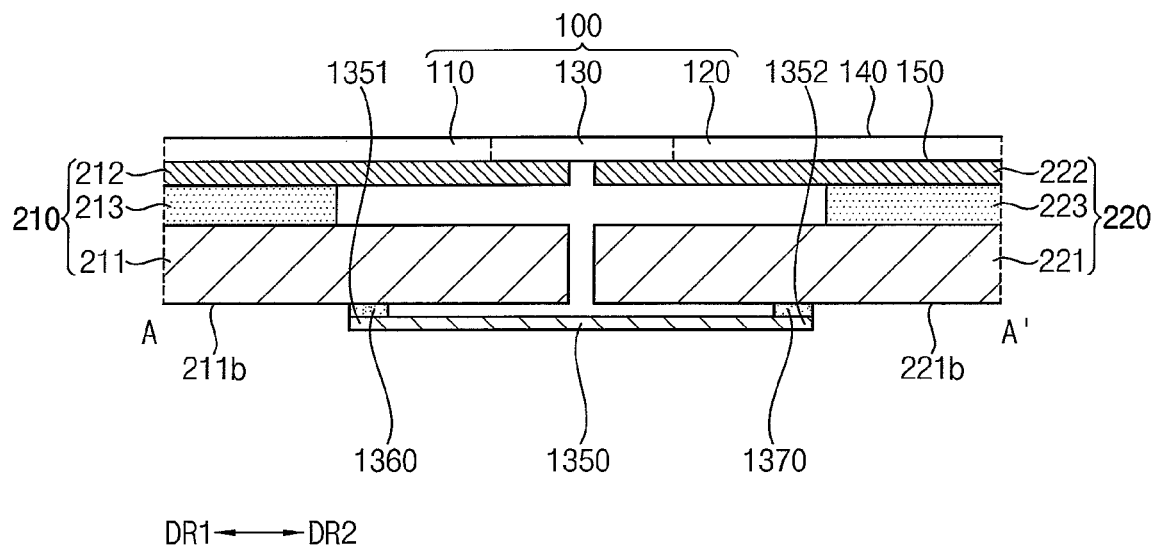

FIGS. 12 and 13 are cross-sectional views taken along line A-A' of FIG. 1 illustrating still other exemplary embodiments of the foldable display device.

Foldable display devices of FIGS. 12 and 13 may be substantially the same as or similar to the foldable display device described with reference to FIG. 3 except for protective films 1300 and 1350. Accordingly, repetitive descriptions of on repeated elements may be omitted for conciseness.

Referring to FIGS. 12 and 13, in exemplary embodiments, the protective film may be attached to the first cover 211 and the second cover 221. As illustrated in FIG. 12, in an exemplary embodiment, a first end 1301 of the protective film 1300 may be attached to an upper surface 211a of the first cover 211, and a second end 1302 of the protective film 1300 may be attached to an upper surface 221a of the second cover 221. In this case, a first adhesive member 1410 may be disposed between the upper surface 211a of the first cover 211 and the first end 1301 of the protective film 1300, and a second adhesive member 1420 may be disposed between the upper surface 221a of the second cover 221 and the second end 1302 of the protective film 1300.

As illustrated in FIG. 13, in an exemplary embodiment, the protective film 1350 may be disposed below the first and second covers 211 and 221. A first end 1351 of the protective film 1350 may be attached to a lower surface 211b of the first cover 211, and a second end 1352 of the protective film 1350 may be attached to a lower surface 221b of the second cover 221. In this case, a first adhesive member 1360 may be disposed between the lower surface 211b of the first cover 211 and the first end 1351 of the protective film 1350, and a second adhesive member 1370 may be disposed between the lower surface 221b of the second cover 221 and the second end 1352 of the protective film 1350.

Figure 14:
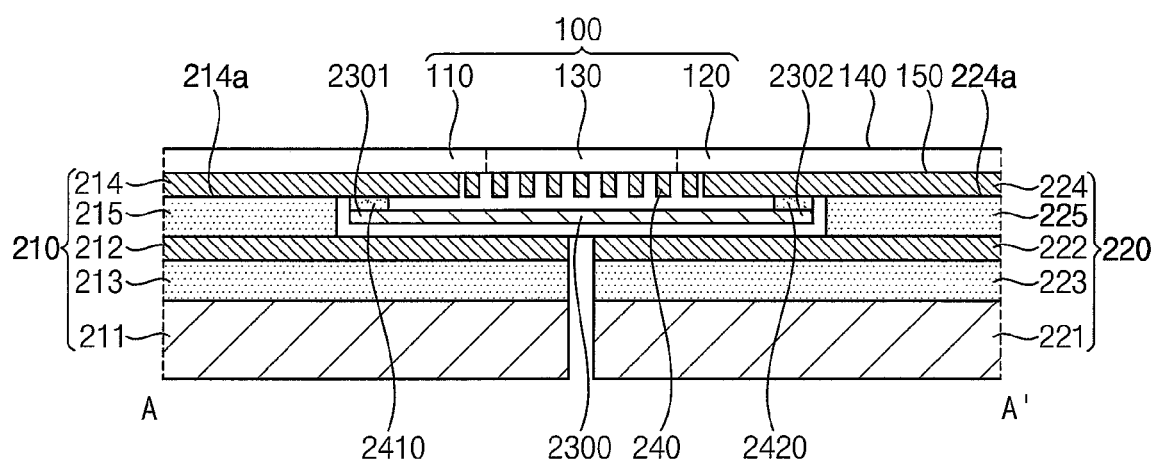
FIG. 14 is a cross-sectional view taken along line A-A' of FIG. 1 illustrating yet still another exemplary embodiment of the foldable display device.

FIG. 14 is a cross-sectional view taken along line A-A' of FIG. 1 illustrating yet still another exemplary embodiment of the foldable display device.

A foldable display device of FIG. 14 may be substantially the same as or similar to the foldable display device described with reference to FIG. 3 except for the addition of a third support plate 214, a fourth support plate 224 and a fifth support plate 240 and the position of a protective film 2300. Accordingly, repetitive descriptions of repeated elements may be omitted for conciseness.

Referring to FIG. 14, in an exemplary embodiment, the first support portion 210 may further include the third support plate 214 and a third adhesive layer 215, and the second support portion 220 may further include the fourth support plate 224 and a fourth adhesive layer 225. Further, the folding unit 200 may further include the fifth support plate 240.

The third support plate 214 may be disposed between the first non-bendable portion 110 of the flexible display module 100 and the first support plate 212. The third support plate 214 may support the first non-bendable portion 110. The third adhesive layer 215 may be disposed between the first support plate 212 and the third support plate 214. The third adhesive layer 215 may combine and/or attach the first support plate 212 and the third support plate 214.

The fourth support plate 224 may be disposed between the second non-bendable portion 120 of the flexible display module 100 and the second support plate 222. The fourth support plate 224 may support the second non-bendable portion 120. The fourth adhesive layer 225 may be disposed between the second support plate 222 and the fourth support plate 224. The fourth adhesive layer 225 may combine and/or attach the second support plate 222 and the fourth support plate 224.

In an exemplary embodiment, the protective film 2300 may be attached to the third support plate 214 and the fourth support plate 224. For example, the protective film 2300 may be disposed in a region formed between the first support plate 212 and the third support plate 214 and between the second support plate 222 and the fourth support plate 224, and a first end 2301 of the protective film 2300 may be attached to a lower surface 214a of the third support plate 214, and a second end 2302 of the protective film 2300 may be attached to a lower surface 224a of the fourth support plate 224. Accordingly, the protective film 2300 may cover and/or overlap the back surface 150 of the bendable portion 130. In this case, a first adhesive member 2410 may be disposed between the lower surface 214a of the third support plate 214 and the first end 2301 of the protective film 2300, and a second adhesive member 2420 may be disposed between the lower surface 224a of the fourth support plate 224 and the second end 2302 of the protective film 2300. In an exemplary embodiment, unlike the foldable display device of FIG. 3, the first adhesive layer 213 may overlap the first non-bendable portion 110 and the bendable portion 130, and the second adhesive layer 223 may overlap the second non-bendable portion 120 and the bendable portion 130.

Figure 15:
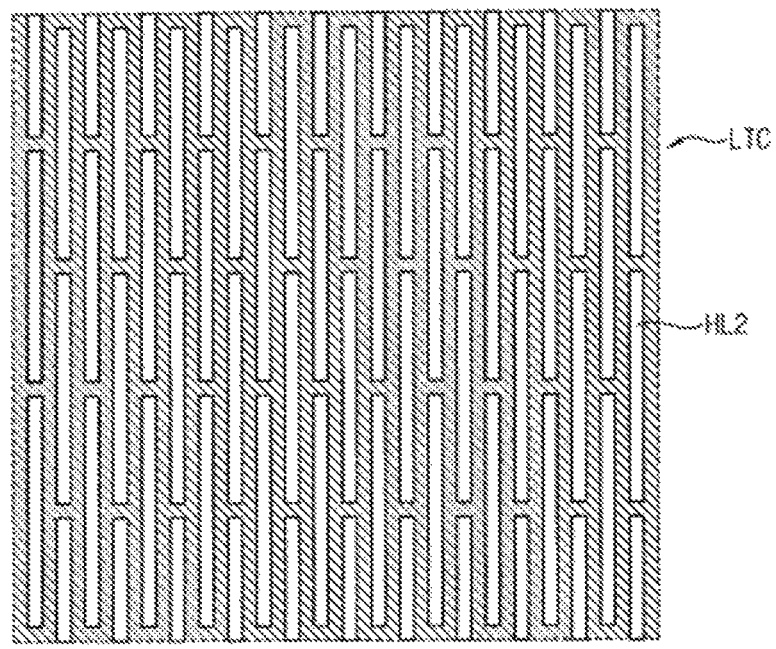
FIG. 15 is a plan view of an exemplary embodiment of the fifth support plate of FIG. 14.

FIG. 15 is a plan view of an exemplary embodiment of the fifth support plate of FIG. 14.

Referring to FIGS. 14 and 15, the fifth support plate 240 may be disposed between the third support plate 214 and the fourth support plate 224. The fifth support plate 240 may be disposed on the back surface 150 of the bendable portion 130 of the flexible display module 100, the back surface 150 of the first non-bendable portion 110 of the flexible display module 100 adjacent to the bendable portion 130, and the back surface 150 of the second non-bendable portion 120 of the flexible display module 100 adjacent to the bendable portion 130.

A plurality of holes HL2 may be formed in the fifth support plate 240. In an exemplary embodiment, the holes HL2 may be alternately arranged along the first direction in a plan view. In an exemplary embodiment, the fifth support plate 240 may have a lattice pattern LTC formed by the holes HL2. The fifth support plate 240 may have the lattice pattern LTC to be deformable, so that the fifth support plate 240 may be bent along the bending of the bendable portion 130 of the flexible display module 100 when the foldable display device is folded. Further, the lattice pattern LTC may serve to block foreign substances from being introduced into the fifth support plate 240 and/or the flexible display module 100 from outside.

In an exemplary embodiment, the foldable display device may be applied to a display device included in a computer, a notebook, a mobile phone, a smartphone, a smart pad, a PMP, a PDA, an MP3 player, or the like.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A foldable display device, comprising:
a flexible display module including a first substantially non-bendable portion, a second substantially non-bendable portion, and a bendable portion between the first non-bendable portion and the second non-bendable portion;
a support member comprising a folding unit disposed on the flexible display module, the support member including a hinge portion, a first portion connected to the hinge portion and supporting the first non-bendable portion and a second portion connected to the hinge portion and supporting the second non-bendable portion to permit the first and second portions to rotate about the hinge portion, wherein the first portion and the second portion are spaced apart from each other at a predetermined interval overlapping the bendable portion, the first portion comprises a first support portion, and the second portion comprises a second support portion, wherein the first support portion includes a first cover disposed on the first non-bendable portion and a first support plate disposed between the first non-bendable portion and the first cover, and the second support portion includes a second cover disposed on the second non-bendable portion and a second support plate disposed between the second non-bendable portion and the second cover; and
a protective layer attached to the first portion and the second portion to cover the predetermined interval and the bendable portion disposed between the first portion and the second portion, the protective layer including a stretchable material having a mesh structure.

2. The foldable display device of claim 1, wherein the protective layer comprises a film formed of at least one of nylon and polyurethane (PU).

3. The foldable display device of claim 1, wherein the stretchable material comprises a synthetic textile including twisted filaments coupled to each other, and
wherein each of the filaments has a thickness of about 20 μm to about 400 μm.

4. The foldable display device of claim 3, wherein the protective layer includes at least one hole formed by the filaments, and
wherein the at least one hole has a width of about 40 μm or less.

5. The foldable display device of claim 1, wherein the predetermined interval comprises a gap.

6. The foldable display device of claim 1, wherein the protective layer is attached to the first cover and the second cover or to the first support plate and the second support plate.

7. The foldable display device of claim 6, wherein the protective layer is attached to an upper surface of the first cover and an upper surface of the second cover.

8. The foldable display device of claim 6, wherein the protective layer is attached to a lower surface of the first cover and a lower surface of the second cover.

9. The foldable display device of claim 1, wherein the first support portion further includes a third support plate disposed between the first non-bendable portion and the first support plate, and
wherein the second support portion further includes a fourth support plate disposed between the second non-bendable portion and the second support plate.

10. The foldable display device of claim 9, wherein the protective layer is attached to the third support plate and the fourth support plate.

11. The foldable display device of claim 9, wherein the folding unit further includes a fifth support plate disposed between the third support plate and the fourth support plate and having a lattice pattern.

12. The foldable display device of claim 1, wherein each of the first support plate and the second support plate is formed of at least one of stainless steel, copper (Cu), and graphite.

13. The foldable display device of claim 12, wherein each of the first support plate and the second support plate includes:
a first sub-support plate formed of stainless steel;
a second sub-support plate disposed on the first sub-support plate and formed of stainless steel; and
a third sub-support plate disposed between the first sub-support plate and the second sub-support plate and formed of at least one of copper and graphite.

14. The foldable display device of claim 1, wherein the protective layer has a first end and a second end attached to the first portion and the second portion, respectively, and
wherein a distance between the first end and the second end of the protective layer is at least four times a radius of curvature of the bendable portion when the flexible display module is bent.

15. The foldable display device of claim 1, further comprising:
a protective member disposed between the flexible display module and the support member, the protective member including a base layer and a cushion layer disposed on the base layer and having a porous structure.

16. The foldable display device of claim 15, wherein the cushion layer is formed of a synthetic resin foam.

17. The foldable display device of claim 1, wherein the first non-bendable portion and the second non-bendable portion each have a display surface that faces each other when the flexible display module is bent.

18. A foldable display device, comprising:
a flexible display module including a first substantially non-bendable portion, a second substantially non-bendable portion, and a bendable portion between the first non-bendable portion and the second non-bendable portion;
a support member disposed on the flexible display module, the support member including a hinge portion, a first portion connected to the hinge portion and supporting the first non-bendable portion and a second portion connected to the hinge portion and supporting the second non-bendable portion to permit the first and second portions to rotate about the hinge portion; and
a protective layer attached to the first portion and the second portion to cover the bendable portion disposed between the first portion and the second portion, the protective layer including a stretchable material having a mesh structure,
wherein the protective layer includes a plurality of sub-protective layers stacked on each other and each formed of the stretchable material having the mesh structure.

19. A foldable display device, comprising:
a flexible display module including a first substantially non-bendable portion, a second substantially non-bendable portion, and a bendable portion between the first non-bendable portion and the second non-bendable portion;
a support member disposed on the flexible display module, the support member including a hinge portion, a first portion connected to the hinge portion and supporting the first non-bendable portion and a second portion connected to the hinge portion and supporting the second non-bendable portion to permit the first and second portions to rotate about the hinge portion;
a protective layer having a first end and a second end attached to the first portion and the second portion, respectively, to cover the bendable portion disposed between the first portion and the second portion, the protective layer including a stretchable material having a mesh structure;
a first adhesive member disposed between the first end of the protective layer and the first portion; and
a second adhesive member disposed between the second end of the protective layer and the second portion.

* * * * *